United States Patent

Ohta

[15] 3,635,774

[45] Jan. 18, 1972

[54] METHOD OF MANUFACTURING A SEMICONDUCTOR DEVICE AND A SEMICONDUCTOR DEVICE OBTAINED THEREBY

[72] Inventor: Masaya Ohta, Tokyo, Japan

[73] Assignee: Hitachi, Ltd., Tokyo, Japan

[22] Filed: May 1, 1968

[21] Appl. No.: 725,641

[30] Foreign Application Priority Data

May 4, 1967 Japan....................................42/28090

[52] U.S. Cl.....................................156/17, 156/11, 148/187, 317/235, 29/578

[51] Int. Cl...........................................H01l 7/50, H01l 7/00

[58] Field of Search........................156/17, 11; 148/15, 187; 317/235; 29/578

[56] References Cited

UNITED STATES PATENTS

| | | | |
|---|---|---|---|
| 3,334,281 | 8/1967 | Ditrick | 317/235 |
| 3,455,020 | 7/1969 | Dawson et al. | 29/571 |
| 3,479,237 | 11/1969 | Bergh et al. | 156/11 |

*Primary Examiner*—Jacob H. Steinberg
*Attorney*—Craig, Antonelli & Hill

[57] ABSTRACT

A method of manufacturing a semiconductor device comprising selective etching of a phosphorus glass layer covering the surface of a semiconductor substrate using a silicon nitride film selectively formed on said glass layer as a mask.

8 Claims, 8 Drawing Figures

INVENTOR
MASAYA OHTA

BY Craig & Antonelli
ATTORNEYS

METHOD OF MANUFACTURING A SEMICONDUCTOR DEVICE AND A SEMICONDUCTOR DEVICE OBTAINED THEREBY

This invention relates to a method of manufacturing a semiconductor device and more particularly to a method of selective etching a so-called passivation film covering the surface of the semiconductor substrate.

Usually a semiconductor element such as a transistor is coated with an insulating passivation film such as silicon oxide to protect the surface from the external atmosphere. Specifically when the semiconductor substrate is made of silicon, the passivation film is generally of silicon oxide, e.g., silicon dioxide ($SiO_2$). While such an oxide film effectively protects the surface of the element, it tends to deteriorate the characteristics of the element.

Such a defeat is due to the fact that the conventional oxide film has a property to increase the apparent donor density of a semiconductor surface underlying the oxide film. For example, the surface of a P-type silicon substrate is often inverted into an N-type region, which is unfavorable because of leakage current flows through the region. This phenomenon is called channel effect and generally caused by the existence of metal ions in the oxide film. Such ions in the film induce electrons in the semiconductor surface adjacent to the film, and thereby vary the surface characteristics of the substrate.

As a countermeasure to this problem an improvement has been proposed. Namely, a vitrifaction treatment is applied to the conventional oxide film to form on the surface of the oxide film a glass layer containing phosphorus oxide.

However, this method is disadvantageous from a manufacturing point of view, as will be explained with reference to the drawings. Briefly speaking, the photoresist material cannot be deposited closely on the glass layer due to its weak adherence so that it is impossible to apply a selective etching treatment accurately to the glass layer. Further, since the glass layer containing phosphorus oxide has a hygroscopic property, it considerably absorbs moisture during or after manufacturing which causes obstacles to the normal functioning of the semiconductor element.

Therefore, one object of this invention is to provide an improved method of manufacturing a semiconductor device having stable electrical characteristics.

Another object of this invention is to provide a new method of a highly accurate selective etching treatment of a glass layer containing mainly silicon oxide and oxide of at least one of phosphorus, boron, and lead.

A further object of this invention is to provide a semiconductor device having excellent reliability.

Figure 1:
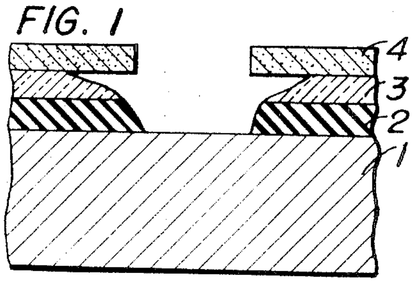

These and other objects and features of this invention will be more readily understood from the detailed explanation taken in conjunction with the accompanying drawings, in which;

FIG. 1 is a partial cross-sectional view showing a prior art semiconductor wafer subjected to etching treatment.

FIGS. 2*a* to 2*f* are partial cross-sectional views of a semiconductor wafer during every manufacturing step of a semiconductor device according to one embodiment of this invention.

Figure 3:
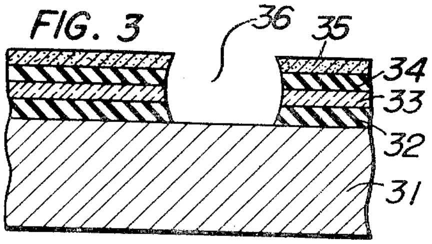

FIG. 3 is a cross-sectional view of a semiconductor wafer showing a modified embodiment of this invention.

Prior to the detailed explanation of the preferred embodiments of the invention a brief explanation will be given of a prior art device with reference to FIG. 1.

A substrate 1 coated with an oxide film 2 is disposed in diffusion furnace and subjected to heat treatment at about 950° C. in an atmosphere containing e.g., phosphorus to deposit a phosphate glass layer 3 on the surface of the oxide film 2. Since the glass layer 3 covers entirely the surface of the oxide film 2 and at the same time acts to adsorb the mobil ions existing therein, these ions are prevented from moving in the oxide film 2. Thus the channel effect is considerably suppressed.

However, when the element having such a phosphate glass layer 3 is subjected to perforation treatment before attaching the electrode, the following defect is recognized. Namely, during the etching treatment for perforating through the film 2 and the layer 3, the phosphate glass layer portion is rapidly and excessively etched. FIG. 1 shows an enlarged view of the surface of the element under such circumstances. It was observed that although the glass layer 3 is completely covered with a photosensitive mask 4, it is excessively etched in a lateral direction (large side etching) due to the weak adhesion. The adjacent oxide film 2 suffers from this influence, and this brings about many failures in the following evaporation step for fitting electrodes.

This invention is intended to solve this problem. The glass layer is closely coated with an etching-proof mask material. The conventional defect can be eliminated by using as mask material a silicon nitride film. The gist of this invention is to selectively coat the surface of the glass layer covering the surface of a semiconductor substrate with a silicon nitride film and thereafter to apply the desired treatment to the surface of the element. An embodiment of this invention will be explained hereinafter referring to the accompanying drawings.

Figure 2A:
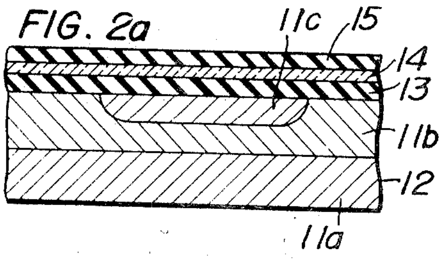

In FIG. 2*a* the major surface of a silicon substrate 12 which contains an N-type collector region 11*a*, a P-type base region 11*b* and an N-type emitter region 11*c* is covered with a silicon oxide film 13, a glass layer 14 of mainly silicon oxide and phosphorus oxide (hereinafter referred to as a phosphorus glass layer), and a silicon nitride film 15. This composite body is obtained as follows. Using the selective diffusion technique of boron, a P-type base region 11*b* is formed on the N-type silicon substrate with the thermally grown silicon oxide film 13 as a selective mask. An N-type emitter region 11*c* is formed by selective diffusion of phosphorus, the phosphorus glass layer 14 being formed simultaneously. The body thus constructed is disposed in a furnace containing ammonium ($NH_3$), monosilane ($SiH_4$) and hydrogen gas. Ammonium and monosilane thermally react in the furnace maintained at about 800° C. to form a silicon nitride ($Si_3N_4$) film 15. The growth rate of $Si_3N_4$ is about 30 A./min. so that treatment for 20 min. yields a silicon nitride film 15 of 500 to 600 A. thickness in close contact with the phosphorus glass layer 14.

The silicon oxide film 13 is about 3,000 to 10,000 A. thick. Actually the thickness of the silicon oxide films on the base region and the emitter region is slightly different so that the boundary between these oxide films becomes steplike. For the sake of brevity this step is omitted in FIGS. 2*a* to 2*f*. The silicon nitride film is selected to be 500 to 1,500 A. thick.

Figure 2B:
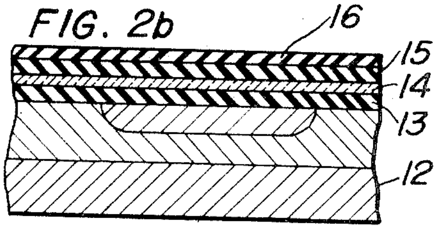

Next as shown in FIG. 2*b*, the silicon dioxide film 16 is made 4,000 to 5,000 A. thick by chemically decomposing monosilane ($SiH_4$) in the oxidizing atmosphere at about 300 to 400° C.

Figure 2C:
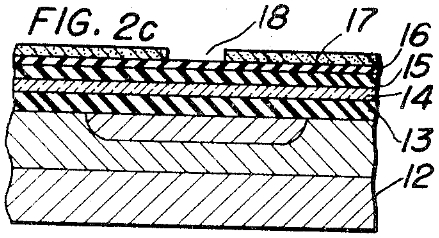

Using the well-known photoresist technique, an etching-proof photoresist film 17 having a hole 18 is formed on the silicon dioxide film 16 as shown in FIG. 2*c*.

Figure 2D:
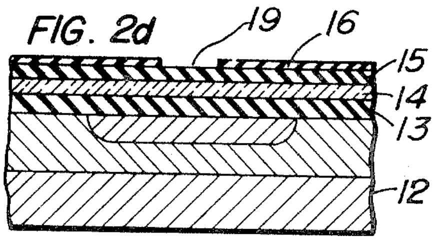

One portion of the silicon dioxide film 16 is exposed by the hole 18 is subjected to an etchant mainly of hydrofluoric acid (HF) e.g., $HF-HNO_3$ system or $HF-NH_4F$ system thereby to form a hole 19 having substantially the same size as that of hole 18. Thus a selective portion of the silicon nitride film 15 is exposed. Thereafter, the photoresist film 16 is removed by a suitable solution such as a trichloroethylene solution. FIG. 2*d* shows this state.

Figure 2E:
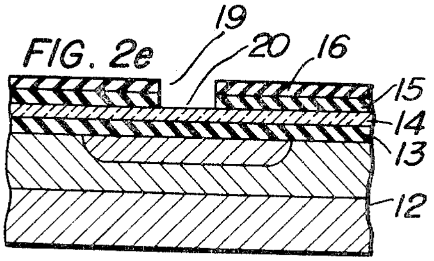
Figure 2F:
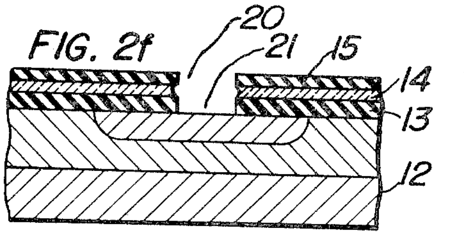

The body is dipped into boiling phosphoric acid at about 180° C. so that only the selected portion of the nitride film 15 may be exposed. The nitride film 15 is selectively etched with the silicon dioxide film 16 as a selective mask, obtaining a body as shown in FIG. 2*e* where a hole 20 thereby obtained is shown.

In the final stage using the above-mentioned etchant containing HF, the exposed phosphorus glass layer 14 and the silicon oxide film 13 thereunder are selectively etched with the silicon nitride film 15 as a selective mask, forming through the glass layer 14 and the oxide film 13 a hole 21 having substantially the same size as that of the hole 20. The etch rates of the above etchant for each of phosphorus glass and silicon oxide differ, the phosphorus glass layer 14 being etched a little excessively. (See FIG. 2*f*) . However, this phenomenon causes no practical problem.

Next, electrode material is deposited on the exposed surface of the substrate 12.

According to the embodiment of this invention as described hereinabove, the silicon nitride film 15 is closely adhered to the phosphorus glass layer 14 so that selective etching is more accurately done than by the conventional technique.

Examination of a semiconductor device or a transistor obtained in the above-mentioned manner has found as additional effect that the device has extremely stable electrical characteristics and excellent reliability.

The reason for such effects is assumed to be based on the fact that the water-repellent silicon nitride film covers closely the phosphorus glass layer having hygroscopic property.

Although in the above embodiment of the silicon nitride film is selectively etched by boiling phosphoric acid with a silicon oxide film 16 as a mask, a method as shown in FIG. 3 may be applied. In FIG. 3 a silicon oxide film 32, a glass layer 33 and a silicon nitride film 34 are formed on the major surface of semiconductor substrate 31. A photoresist material 35 such as KPR (trade name used by Eastman Kodak Company) is formed on the nitride film 34. A hole 36 is formed by the $HF-NH_4F$ system etchant with the photoresist material as a mask. A molybdenum film, etc. may be used in place of the photoresist material.

The passivation film covering directly the substrate and the glass layer as described in the above embodiments are merely exemplary and not restrictive. Generally, phosphate glass, boron glass and lead glass which normally essentially consists of silicon oxide and phosphorous oxide, silicon oxide and boron oxide and silicon oxide and lead oxide, respectively and which are used in semiconductor element are more easily etched with he silicon nitride film is good. So, this invention can be applied to these kinds of glass and an arbitrary combination thereof. It is apparent that the same effect will be obtained if the glass layer is coated directly on the surface of the semiconductor substrate without inserting a passivation film like a $SiO_2$ film therebetween. The silicon nitride film covering the glass layer may be left or removed. The formation of the silicon nitride film is not limited to the method of the above embodiments but may be made by reactive spattering of silicon in a nitrogen atmosphere. Other minute modifications may be made by those skilled in the art without departing from the spirit and scope of the appended claims.

What is claimed is:

1. A method of manufacturing a semiconductor device comprising the steps of:
   forming a silicon oxide layer on one major surface of a semiconductor substrate;
   covering said silicon oxide layer on said semiconductor substrate with a glass layer containing silicon oxide and an oxide of at least one of phosphorus, boron and lead;
   depositing on said glass layer a silicon nitride layer having a hole therein to expose a surface of said glass layer; and,
   removing said glass layer and said silicon oxide layer through said hole to expose a surface of said semiconductor substrate by immersing the thus produced body into an etchant of mainly hydrofluoric acid solution.

2. A method of manufacturing a semiconductor device according to claim 1, wherein silicon nitride is deposited from vapor phase on the surface of said glass layer to form a silicon nitride film and thereafter and silicon nitride film is subjected to boiling phosphoric acid with a silicon oxide film as a selective mask thereby to cover selectively the surface of said glass layer with said silicon nitride film.

3. A method of manufacturing a semiconductor device comprising the steps of:
   forming a silicon oxide layer on one major surface of a semiconductor substrate;
   covering said silicon oxide layer on said semiconductor substrate with a glass layer containing silicon oxide and an oxide of at least one of phosphorus, boron and lead;
   depositing a silicon nitride film on the entire top surface of said glass layer;
   forming a silicon dioxide layer having at least one hole therein the surface of said silicon nitride film;
   dipping said substrate into a boiling phosphoric acid solution and removing said silicon nitride film exposed by said hole, thereby exposing a surface of said glass layer underlying said silicon nitride film within said hole; and removing said glass layer and said silicon oxide layer through said hole to expose a surface of said semiconductor substrate by subjecting said exposed glass layer to an etchant of mainly hydrofluoric acid solution with said silicon nitride film as a selective mask.

4. A method of manufacturing a semiconductor device according to claim 3, wherein said silicon dioxide layer is 4,000 to 5,000 A. thick and said silicon nitride film is about 500 to 600 A. thick.

5. A method of manufacturing a semiconductor device comprising the steps of preparing a semiconductor substrate, one major surface of which is covered by a doped glass layer;
   covering said glass layer with a silicon nitride film;
   selectively subjecting the exposed surface of said silicon nitride film to an etchant primarily affecting said silicon nitride film while leaving the glass layer substantially unaffected to constitute said silicon nitride film an etching mask for said glass layer; and thereafter selectively subjecting said glass layer to an etchant that leaves said silicon nitride film substantially unaffected so that said silicon nitride film forms an etching mask for said glass layer in the presence of said second-mentioned etchant.

6. A method according to claim 5, characterized in that said silicon nitride film is selectively etched by forming thereon a further silicon oxide layer which is selectively subjected at its exposed surface to an etchant leaving the silicon nitride film substantially unaffected to constitute said further silicon oxide layer an etching mask for said silicon nitride film, and thereafter subjecting the thus exposed surface of said silicon nitride film to an etchant leaving said further silicon oxide layer substantially unaffected.

7. A method according to claim 6, characterized in that said silicon nitride film is about 500 to 600A. in thickness.

8. A method according to claim 7, wherein said silicon oxide passivation layer is about 3,000 to 10,000A. in thickness.

* * * * *